(12) United States Patent
Rong et al.

(10) Patent No.: US 9,214,448 B2
(45) Date of Patent: Dec. 15, 2015

(54) BUNDLED MEMORY AND MANUFACTURE METHOD FOR A BUNDLED MEMORY WITH AN EXTERNAL INPUT/OUTPUT BUS

(71) Applicant: Etron Technology, Inc., Hsinchu (TW)

(72) Inventors: Bor-Doou Rong, Hsinchu County (TW); Chun Shiah, Hsinchu (TW)

(73) Assignee: Etron Technology, Inc., Hsinchu (TW)

( * ) Notice: Subject to any disclaimer, the term of this patent is extended or adjusted under 35 U.S.C. 154(b) by 0 days.

(21) Appl. No.: 14/315,285

(22) Filed: Jun. 25, 2014

(65) Prior Publication Data

US 2014/0308809 A1 Oct. 16, 2014

Related U.S. Application Data

(62) Division of application No. 13/798,227, filed on Mar. 13, 2013, now Pat. No. 9,070,558.

(60) Provisional application No. 61/612,987, filed on Mar. 20, 2012.

(51) Int. Cl.
| | |
|---|---|
| *H01L 21/66* | (2006.01) |
| *H01L 25/065* | (2006.01) |
| *H01L 23/538* | (2006.01) |
| *H01L 21/768* | (2006.01) |
| *H01L 23/00* | (2006.01) |
| *H01L 21/78* | (2006.01) |
| *H01L 23/544* | (2006.01) |
| *H01L 27/108* | (2006.01) |

(52) U.S. Cl.
CPC .......... *H01L 25/0655* (2013.01); *H01L 21/768* (2013.01); *H01L 21/78* (2013.01); *H01L 23/5381* (2013.01); *H01L 23/544* (2013.01); *H01L 24/03* (2013.01); *H01L 22/32* (2013.01); *H01L 27/10897* (2013.01); *H01L 2924/0002* (2013.01)

(58) Field of Classification Search
CPC . H01L 23/538; H01L 23/5381; H01L 21/768; H01L 23/544; H01L 21/78; H01L 22/32; H01L 24/03
USPC ............................................. 438/17, 15, 612
See application file for complete search history.

(56) References Cited

U.S. PATENT DOCUMENTS

| | | | | |
|---|---|---|---|---|
| 5,691,570 | A * | 11/1997 | Kozuka | 257/693 |
| 2002/0157082 | A1* | 10/2002 | Shau | 716/19 |
| 2003/0066040 | A1* | 4/2003 | Morgan | 716/8 |
| 2004/0113250 | A1 | 6/2004 | Khandros | |
| 2006/0066040 | A1 | 3/2006 | Terao | |

* cited by examiner

*Primary Examiner* — Minh-Loan Tran
*Assistant Examiner* — Farid Khan
(74) *Attorney, Agent, or Firm* — Winston Hsu; Scott Margo

(57) ABSTRACT

A bundled memory includes a substrate, a first memory die, a second memory die, a scribe line, and an electrical connection. The first memory die has a first input/output bus, and the second memory die has a second input/output bus, where the first memory die and the second memory die are formed over the substrate. The scribe line is formed between the first memory die and the second memory die. The electrical connection is formed over the scribe line for electrically connecting to the first input/output bus and the second input/output bus, where the electrical connection is electrically connected to an external input/output bus, where a size of the external input/output bus of the bundled memory is larger than or equal to a size of the first input/output bus and a size of the second input/output bus.

4 Claims, 5 Drawing Sheets

BUNDLED MEMORY AND MANUFACTURE METHOD FOR A BUNDLED MEMORY WITH AN EXTERNAL INPUT/OUTPUT BUS

CROSS REFERENCE TO RELATED APPLICATIONS

This is a division of U.S. patent application Ser. No. 13/798,227, filed on Mar. 13, 2013, which claims the benefit of U.S. Provisional Application No. 61/612,987 filed on Mar. 20, 2012. The above mentioned applications are included in their entirety herein by reference.

BACKGROUND OF THE INVENTION

1. Field of the Invention

The present invention relates to a bundled memory and a manufacture method for a bundled memory with an external input/output bus, and particularly to a bundled memory and a manufacture method for a bundled memory with an external input/output bus that can utilize at least one mask layer formed over a plurality of scribe lines to form electrical connection coupled between input/output buses of any two memory dies.

2. Description of the Prior Art

Please refer to FIG. 1. FIG. 1 is a diagram illustrating a wafer 11 with a plurality of memory dies and a magnified structure of a memory die 12 according to the prior art, where the wafer 11 includes a plurality of repeating units, and each repeating unit is called a memory die (e.g. the memory die 12). As shown in FIG. 1, in the wafer 11, the memory die 12 is isolated from other dies and separated from an adjacent memory die 14 through a scribe line 13. In addition, no signal is connected over die boundaries between the memory die 12 and the memory die 14. After fabrication of the wafer 11 is completed, the wafer 11 is scribed to the plurality of memory dies (e.g. the memory die 12 and the memory die 14) into individual memory devices. As shown in FIG. 1, after the memory die 12 is cut from the wafer 11, the memory die 12 has an input/output circuit 16 and a complete set of bounding pads 17 to communicate with external circuits.

However, after fabrication of the wafer 11 is completed, memory depth and bus width of the memory die 12 and the memory die 14 are fixed. For example, the memory depth and the bus width of the memory die 12 and the memory die 14 are 2M and 32 bits, respectively. Therefore, a memory die provided by the prior art is less flexible for a user.

SUMMARY OF THE INVENTION

An embodiment provides a bundled memory. The bundled memory includes a substrate, a first memory die, a second memory die, a scribe line, and an electrical connection. The first memory die has a first input/output bus, where the first memory die is formed over the substrate. The second memory die has a second input/output bus, where the second memory die is formed over the substrate. The scribe line is formed between the first memory die and the second memory die. The electrical connection is formed over the scribe line for electrically connecting to the first input/output bus and the second input/output bus, where the electrical connection is electrically connected to an external input/output bus, and a size of the external input/output bus is larger than or equal to a size of the first input/output bus and a size of the second input/output bus.

Another embodiment provides a manufacture method for a bundled memory with an external input/output bus. The manufacture method includes providing a substrate; forming a plurality of memory dies over the substrate, and forming a plurality of scribe lines between the plurality of memory dies, where each memory die has an input/output bus; forming a plurality of set of bonding pads over an input/output bus of each memory die; and forming at least one mask layer over the plurality of scribe lines to be electrically connected to the plurality of set of bonding pads of the plurality of memory dies, where the external input/output bus is electrically connected to the at least one mask layer, and the external input/output bus is larger than or equal to the input/output bus.

The present invention provides a bundled memory and a manufacture method for a bundled memory with an external input/output bus. The bundled memory and the manufacture method utilize at least one mask layer formed over a plurality of scribe lines to form electrical connection coupled between input/output buses of any two memory dies. Therefore, the bundled memory provided by the present invention is not limited to original memory depth and bus width of a memory die, that is, the bundled memory provided by the present invention can change memory depth and bus width of the bundled memory according to a requirement of a user. Thus, compared to the prior art, the bundled memory provided by the present invention is more flexible for the user.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
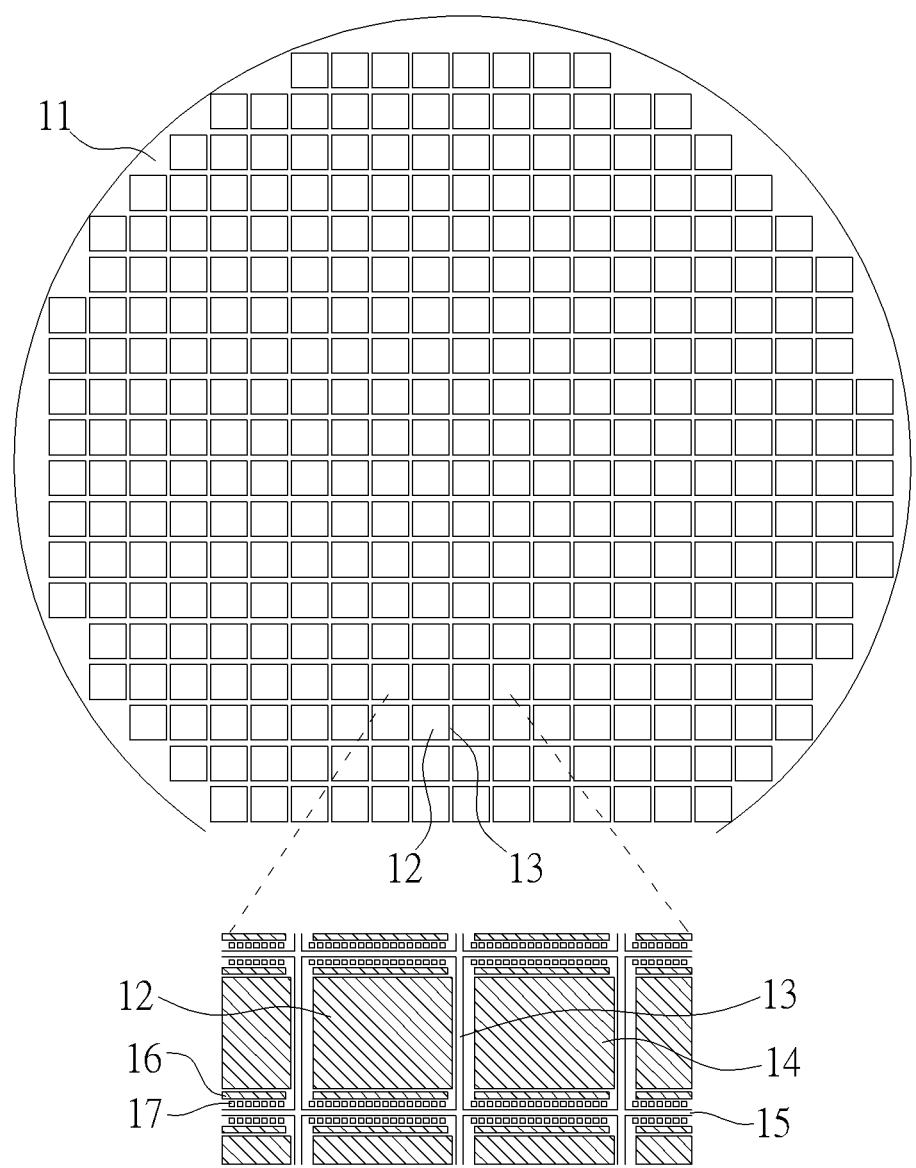
FIG. 1 is a diagram illustrating a wafer with a plurality of memory dies and a magnified structure of a memory die according to the prior art
Figure 2:
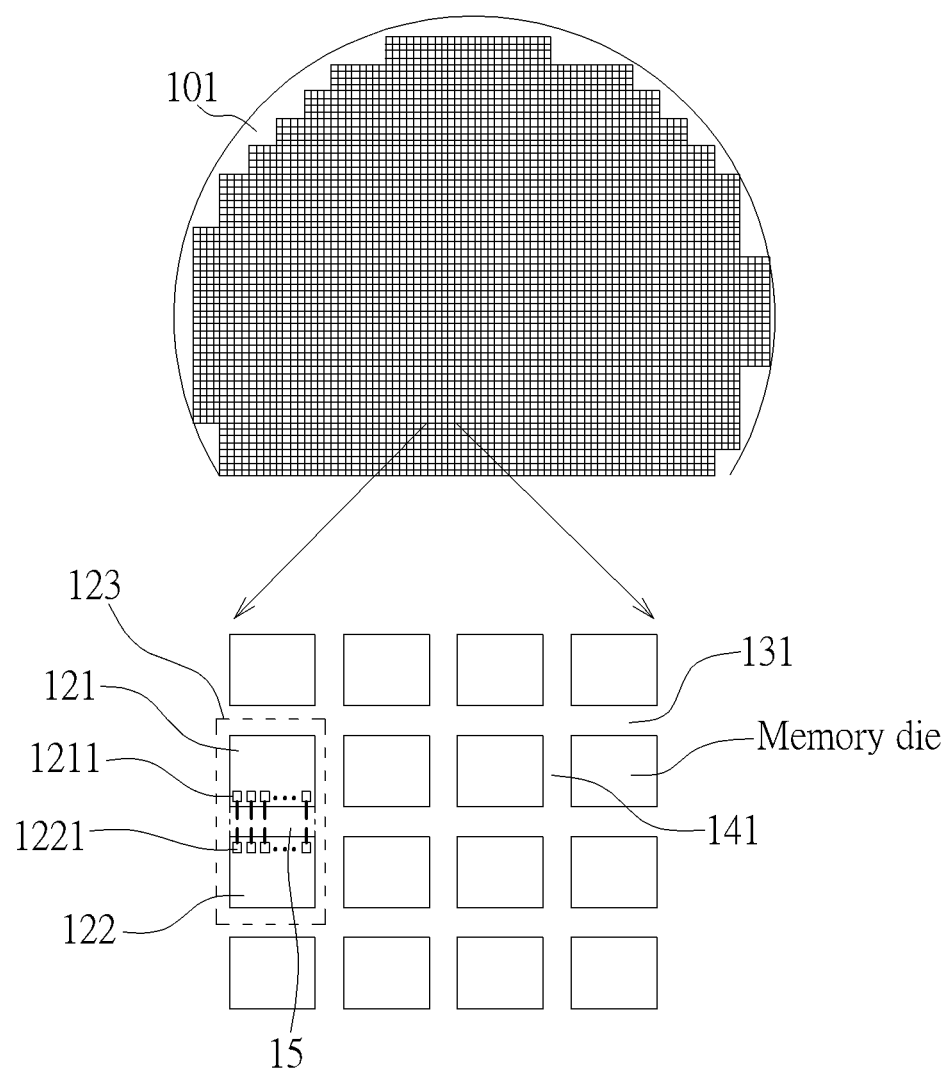
FIG. 2 is a diagram illustrating a wafer with a plurality of memory dies and magnified structures of memory dies according to an embodiment.

Please refer to FIG. 2. FIG. 2 is a diagram illustrating a wafer 101 with a plurality of memory dies and magnified structures of memory dies according to an embodiment. As shown in FIG. 2, the wafer 101 includes a plurality of repeating separable memory dies. The wafer 101 can be a silicon substrate, and the plurality of memory dies can be formed on the silicon substrate according to regular semiconductor process. As shown in FIG. 2, each memory die is isolated from other adjacent memory dies through a horizontal scribe line 131 and a vertical scribe line 141. However, in one embodiment of the present invention, a first memory die 121 and a second memory die 122 can be combined together to form a bundled memory 123, where the first memory die 121 and the second memory die 122 can be any memory dies. For example, the first memory die 121 and the second memory die 122 can be Single-Data-Rate (SDR) memory dies, Double-Data-Rate (DDR) memory dies, Double-Data-Rate Two (DDR2) memory die, Double-Data-Rate Three (DDR3) memory dies, Double-Data-Rate Four (DDR4) memory dies, or other memory dies. As shown in FIG. 2, a first input/output bus 1211 of the first memory die 121 is electrically connected to a second input/output bus 1221 of the second memory die 122, and an electrical connection between the first memory die 121 and the second memory die 122 is formed over a scribe line 15 between the first memory die 121 and the second memory die 122, where the electrical connection can be electrically connected to an external input/output bus of the bundled memory 123, and an external bonding area for electrically connecting to the external input/output bus of the bundled memory 123 can be positioned over an electrical connection of the second input/output bus 1221, the first input/output bus 1211, or the scribe line 15. The first input/output bus 1211 of the first memory die 121 includes a first data bus and a first address bus, the second input/output bus 1221 of the second memory die 122 includes a second data bus and a second address bus, and the external input/output bus of the bundled memory 123 includes an external data bus and an external address bus, where the external data bus can be larger than or equal to the first data bus and the second data bus, and the external address bus can be larger than or equal to the first address bus and the second address bus. For example, if memory depth of the first memory die 121 and the second memory die 122 is 2M and bus width of the first memory die 121 and the second memory die 122 is 32 bits, and the first data bus of the first input/output bus 1211 is electrically connected to the second data bus of the second input/output bus 1221, memory depth of the bundled memory 123 is 4M and bus width of the bundled memory 123 is 32 bits. However, if the first address bus of the first input/output bus 1211 is electrically connected to the second address bus of the second input/output bus 1221, the memory depth of the bundled memory 123 is 2M and the bus width of the bundled memory 123 is 64 bits.

In another embodiment of the present invention, the memory depth and the bus width of the first memory die 121 can be different from the memory depth and the bus width of the second memory die 122. For example, the memory depth and the bus width of the first memory die 121 are 2M and 32 bits, respectively, and the memory depth and the bus width of the second memory die 122 are 4M and 32 bits, respectively. Therefore, after the first data bus of the first memory die 121 is electrically connected to the second data bus of the second memory die 122 to form a bundled memory, memory depth and bus width of the bundled memory are 6M and 32 bits, respectively. On the other hand, if the memory depth and the bus width of the first memory die 121 are 2M and 32 bits, respectively, and the memory depth and the bus width of the second memory die 122 are 2M and 64 bits, respectively, after the first address bus of the first memory die 121 is electrically connected to the second address bus of the second memory die 122 to form a bundled memory, memory depth and bus width of the bundled memory are 2M and 96 bits, respectively.

In addition, the electrical connection formed over the scribe line 15 can be wire bonding connection, redistribution layer (RDL), or another connection implemented by available semiconductor processes. For example, the wafer 101 having the plurality of repeating separable memory dies is first provided, where the wafer 101 is made through a plurality of masks. Then, bonding pads of the first input/output bus 1211 and bonding pads of the second input/output bus 1221 are formed over the first memory die 121 and the second memory die 122, respectively. In addition, at least one mask is formed over the scribe line 15. Thus, the bonding pads of the first input/output bus 1211 and the bonding pads of the second input/output bus 1221 can be electrically connected through the at least one mask formed over the scribe line 15. The at least one mask formed over the scribe line 15 can be corresponding to a metal layer, a polysilicon layer, or another semiconductor layer.

Figure 3:
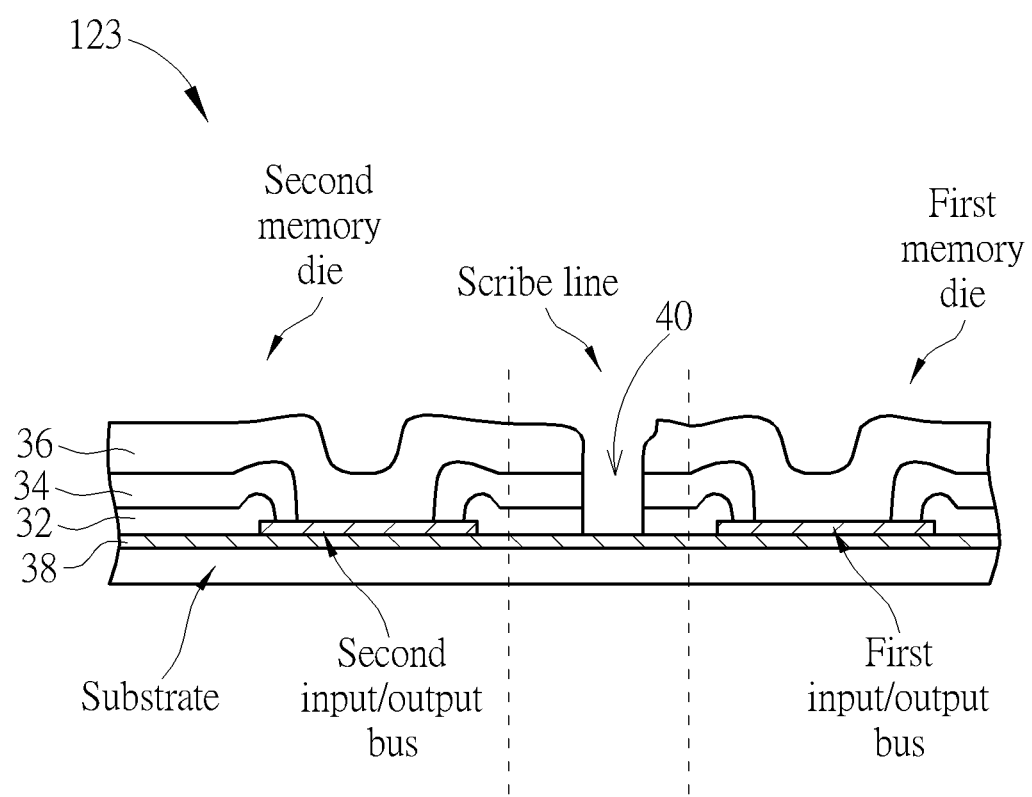
FIG. 3 is a diagram illustrating coupling relationships between the first memory die, the second memory die, and the scribe line.

In another embodiment of the present invention, at least one mask layer made by semiconductor process can be deposited over the scribe line 15. Thus, the bonding pads of the first input/output bus 1211 and the bonding pads of the second input/output bus 1221 can be electrically connected each other, and the external bonding area of the bundled memory 123 can be redistributed or located over the scribe line 15. Please refer to FIG. 3. FIG. 3 is a diagram illustrating coupling relationships between the first memory die 121, the second memory die 122, and the scribe line 15. As shown in FIG. 3, a passivation material layer 32, a first polyimide layer 34, a second polyimide layer 36 and a metal layer (or a polysilicon layer) 38 are deposited over the scribe line 15. The bonding pads of the second input/output bus 1221 is deposited over the second memory die 122, and the bonding pads of the first input/output bus 1211 deposited over the first memory die 121. In addition, the metal layer 38 is electrically connected to the bonding pads of the second input/output bus 1221 and the bonding pads of the first input/output bus 1211. As shown in FIG. 3, the bundled memory 123 has a relocated external bonding point 40, so an external bonding pad can be formed at the external bonding point 40 to be electrically connected to the bonding pads of the second input/output bus 1221 and the bonding pads of the first input/output bus 1211. But, the external bonding point 40 of the present invention is not limited to be located over the scribe line 15. In another embodiment of the present invention, the external bonding point 40 can also be located over the bonding pads of the second input/output bus 1221 or the bonding pads of the first input/output bus 1211. Moreover, a plurality of testing pads (not shown in FIG. 3) can be deposited over the second polyimide layer 36 and located within the scribe line 15 to test the bundled memory 123, where the plurality of testing pads are electrically connected to the external input/output bus of the bundled memory 123. In addition, a plurality of testing circuits can also be deposited over the scribe line 15 included in the bundled memory 123.

Figure 4:
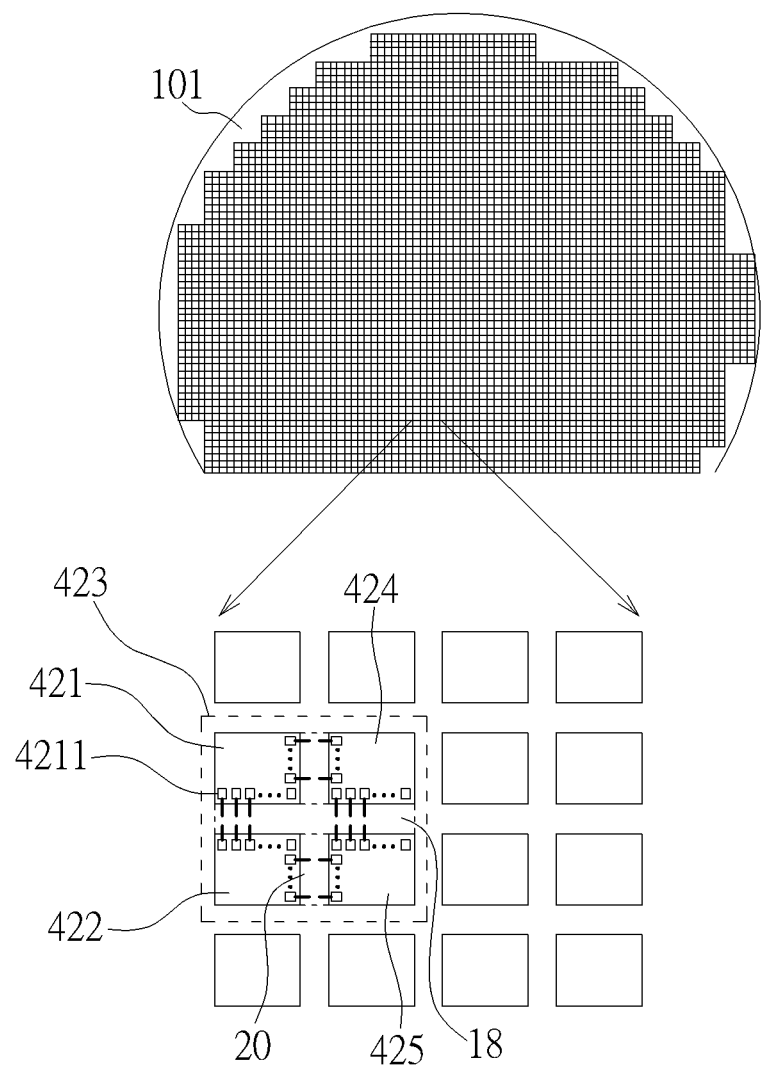
FIG. 4 is a diagram illustrating a wafer with a plurality of memory dies and a bundled memory according to another embodiment.

Please refer to FIG. 4. FIG. 4 is a diagram illustrating a wafer 101 with a plurality of memory dies and a bundled memory 423 according to another embodiment. As shown in FIG. 4, four separable memory dies 421, 422, 424, and 425 can be combined together to form the bundled memory 423, where an input/output bus 4211 of the memory die 421 is electrically connected to input/output buses of the memory dies 422, 424, and 425. Electrical connections between the four memory dies 421, 422, 424, and 425 are formed over a horizontal scribe line 18 and/or a vertical scribe line 20 between the four memory dies 421, 422, 424, and 425. If memory depth of each memory die of the four memory dies 421, 422, 424, and 425 is 2M and bus width of each memory die of the four memory dies 421, 422, 424, and 425 is 32 bits, and data buses of input/output buses of the four memory dies 421, 422, 424, and 425 are electrically connected together, memory depth and bus width of the bundled memory 423 are 8M and 32 bits, respectively; if address buses of the input/output buses of the four memory dies 421, 422, 424, and 425 are electrically connected together, the memory depth and the bus width of bundled memory 423 are 2M and 128 bits, respectively. In addition, an external bonding area for electrically connecting to an external input/output bus of the bundled memory 423 can be located over the input/output buses of the four memory dies 421, 422, 424, and 425, the horizontal scribe line 18, or the vertical scribe line 20.

In addition, the bundled memories of the present invention are not limited to being composed of two separable memory dies and four separable memory dies. That is to say, the bundled memories of the present invention can be composed of a plurality of separable memory dies.

Figure 5:
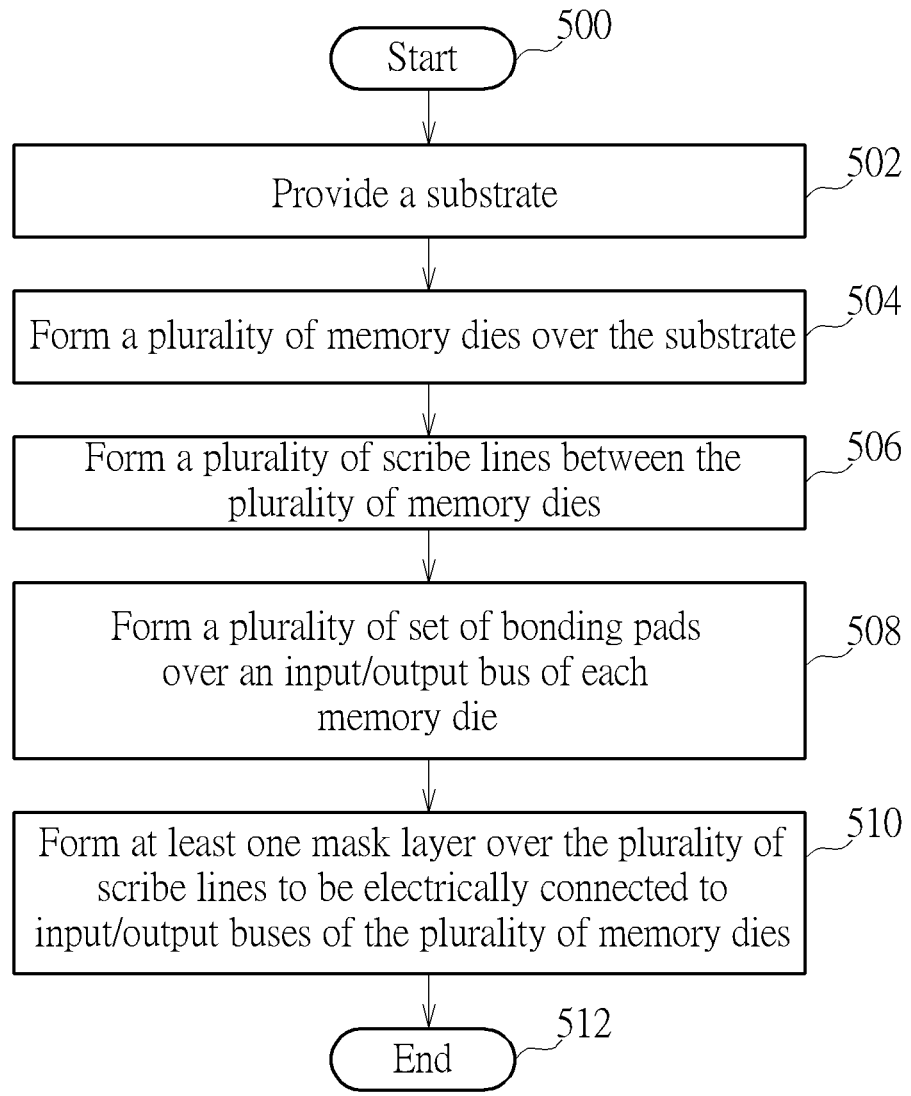
FIG. 5 is a flowchart illustrating a manufacture method for a bundled memory with an external input/output bus according to another embodiment.

Please refer to FIG. 2 and FIG. 5. FIG. 5 is a flowchart illustrating a manufacture method for a bundled memory with an external input/output bus according to another embodiment. The manufacture method in FIG. 5 is illustrated using the wafer 101, the horizontal scribe line 131, the vertical scribe line 141, and the bundled memory 123 in FIG. 2. Detailed steps are as follows:

Step 500: Start.
Step 502: Provide a substrate.
Step 504: Form a plurality of memory dies over the substrate.
Step 506: Form a plurality of scribe lines between the plurality of memory dies.
Step 508: Form a plurality of set of bonding pads over an input/output bus of each memory die.
Step 510: Form at least one mask layer over the plurality of scribe lines to be electrically connected to input/output buses of the plurality of memory dies.
Step 512: End.

In Step 502, as shown in FIG. 2, provide the substrate (e.g. the wafer 101), where the wafer 101 can be a silicon substrate. In Step 504 and Step 506, the plurality of memory dies can be formed on the silicon substrate (the wafer 101) according to the regular semiconductor process, and the plurality of scribe lines can be formed between the plurality of memory dies, e.g. the horizontal scribe line 131 and the vertical scribe line 141 shown in FIG. 2. In Step 508, form a plurality of set of bonding pads over an input/output bus of each memory die. For example, as shown in FIG. 2, the bonding pads of the first input/output bus 1211 and the bonding pads of the second input/output bus 1221 are formed over the first memory die 121 and the second memory die 122, respectively. In Step 510, form at least one mask layer over the plurality of scribe lines. For example, form at least one mask over the scribe line 15. Thus, the bonding pads of the first input/output bus 1211 and the bonding pads of the second input/output bus 1221 can be electrically connected through the at least one mask formed over the scribe line 15, where the at least one mask formed over the scribe line 15 can be corresponding to a metal layer, a polysilicon layer, or another semiconductor layer.

As shown in FIG. 2, the first memory die 121 and the second memory die 122 can be electrically connected together to form the bundled memory 123 through the manufacture method in FIG. 5. Therefore, the first input/output bus 1211 of the first memory die 121 is electrically connected to the second input/output bus 1221 of the second memory die 122, and the electrical connections between the first memory die 121 and the second memory die 122 are formed over the scribe line 15 between the first memory die 121 and the second memory die 122. If the first data bus of the first input/output bus 1211 is electrically connected to the second data bus of the second input/output bus 1221, the memory depth of the bundled memory 123 is greater than the memory depth of the first memory die 121 and the second memory die 122. However, if the first address bus of the first input/output bus 1211 is electrically connected to the second address bus of the second input/output bus 1221, the bus width of the bundled memory 123 is greater than the bus width of the first memory die 121 and the second memory die 122. In addition, the external bonding area for electrically connecting to the input/output bus of the bundled memory 123 can be positioned over the second input/output bus 1221, the first input/output bus 1211, or the scribe line 15.

In another embodiment of the present invention, at least one mask layer made by semiconductor process can be deposited over the scribe line 15. Thus, the bonding pads of the first input/output bus 1211 and the bonding pads of the second input/output bus 1221 can be electrically connected each other, and the external bonding area of the bundled memory 123 can be redistributed or located over the first input/output bus 1211, the second input/output bus 1221, or the scribe line 15. For example, as shown in FIG. 3, the bundled memory 123 has the relocated external bonding point 40 (other external bonding points of the bundled memory 123 not shown in FIG. 3), so an external bonding pad can be formed at the external bonding point 40 to be electrically connected to the bonding pads of the second input/output bus 1221 and the bonding pads of the first input/output bus 1211, where the external bonding point 40 is distributed over the scribe line 15. Moreover, a plurality of testing pads (not shown in FIG. 3) can be deposited over the second polyimide layer 36 and located within the scribe line 15 to test the bundled memory 123, where the plurality of testing pads are electrically connected to the external input/output bus of the bundled memory 123. In addition, a plurality of testing circuits can also be deposited over the scribe line 15 included in the bundled memory 123.

To sum up, the bundled memory and the manufacture method for a bundled memory with an external input/output bus utilize at least one mask layer formed over the plurality of scribe lines to form electrical connection coupled between input/output buses of any two memory dies. Therefore, the bundled memory provided by the present invention is not limited to original memory depth and bus width of a memory die, that is, the bundled memory provided by the present invention can change the memory depth and the bus width of the bundled memory according to a requirement of a user. Thus, compared to the prior art, the bundled memory provided by the present invention is more flexible for the user.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacture method for a bundled memory with an external input/output bus, the manufacture method comprising:
   providing a substrate;
   forming a plurality of memory dies over the substrate, and forming a plurality of scribe lines between the plurality of memory dies;
   forming a plurality of masked layers over the plurality of scribe lines, wherein the plurality of masked layers form an electrical connection, and the external input/output bus is electrically connected to the electrical connection; and
   forming a plurality of test pads over the plurality of masked layers, wherein the plurality of test pads are positioned over the scribe line;
   wherein a plurality of external bonding pads are electrically connected to the plurality of test pads.

2. The manufacture method of claim 1,
   wherein the plurality of external bonding pads are distributed over the plurality of scribe lines or the input/output buses of the plurality of memory dies.

3. A manufacture method for a bundled memory with an external input/output bus, the manufacture method comprising:

provide a substrate;

forming a plurality of memory dies over the substrate, and forming a plurality of scribe lines between the plurality of memory dies, wherein each memory die has an input/output bus;

forming a plurality of masked layers over the plurality of scribe lines to form an electrical connection for electrically connecting to an input/output bus of each memory die of the bundled memory, wherein the external input/output bus is electrically connected to the electrical connection;

wherein a memory depth of the bundled memory is larger than a memory depth of the each memory die of the bundled memory.

4. A manufacture method for a bundled memory with an external input/output bus, the manufacture method comprising:

providing a substrate;

forming a plurality of memory dies over the substrate, and forming a plurality of scribe lines between the plurality of memory dies, wherein each memory die has an input/output bus;

forming a plurality of masked layers over the plurality of scribe lines to form an electrical connection for electrically connecting to an input/output bus of each memory die of the bundled memory, wherein the external input/output bus is electrically connected to the electrical connection;

wherein a memory depth and a bus width of at least one memory die of the bundled memory are different from memory depths and bus widths of other memory dies of the bundled memory.

* * * * *